METHOD AND APPARATUS FOR ELECTROLYTIC TREATMENT
Filed July 21, 1959
Fig. 1
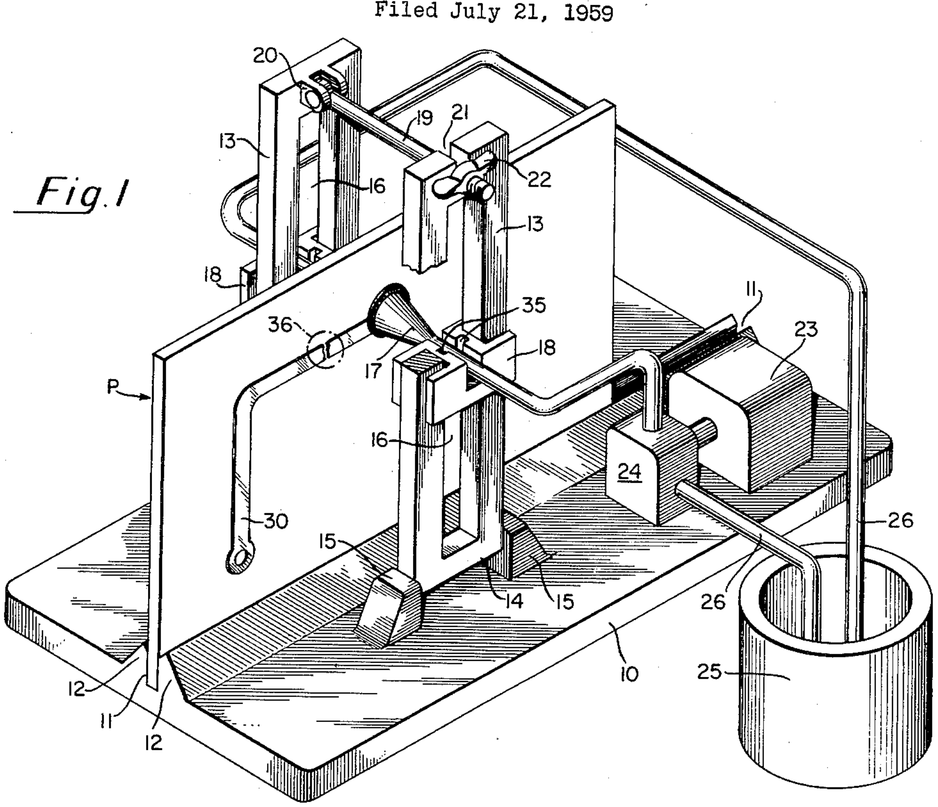
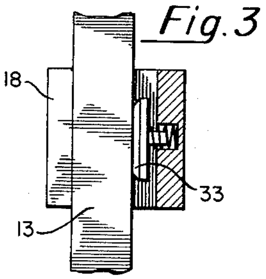
Fig. 2
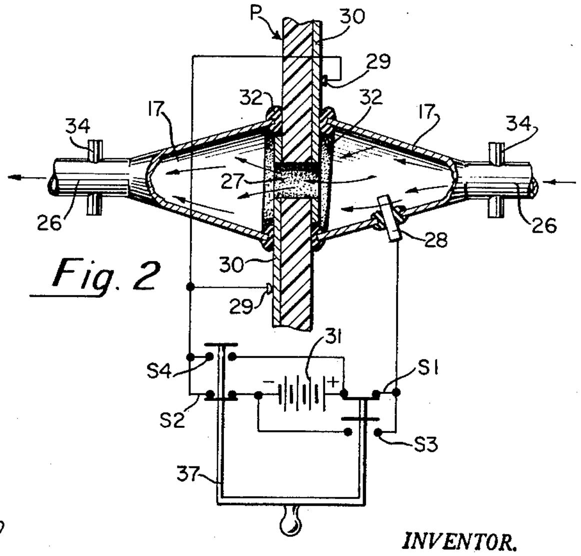
Fig. 4
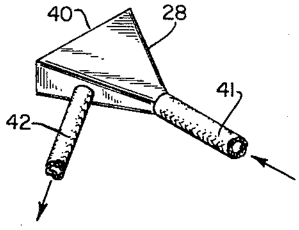
INVENTOR.
DALE L. EHRHART
BY H. Walter [signature]
AGENT United States Patent Office 3,071,521
Patented Jan. 1, 1963

3,071,521

METHOD AND APPARATUS FOR ELECTROLYTIC TREATMENT

Dale L. Ehrhart, Malvern, Pa., assignor to Burroughs Corporation, Detroit, Mich., a corporation of Michigan Filed July 21, 1959, Ser. No. 828,505
4 Claims. (Cl. 204—16)

This invention relates to the electrolytic treatment of solid objects, but more particularly to electrolytic spot plating and/or etching of printed wiring panels.

In the process of manufacturing printed wiring panels, many times after a panel has proceeded through the necessary fabrication steps it is found that operations which should have been completed were inadvertently overlooked. For a better understanding of the problems in connection therewith one common method of fabrication is briefly described below.

The basic material from which printed wiring panels are fabricated usually comes to the manufacturer as a large sheet of insulating material having a micro-thin copper coating on both sides. From this sheet smaller panels are cut to the desired size, and the necessary holes are drilled through it. The panel is then provided with an additional coating of copper on both sides of the panel and on the walls of the drilled holes, the coating through the holes serving to electrically interconnect one side of the panel with the other. A film of photosensitive resist is coated over both sides of the panel, after which it is exposed to light through a negative defining the necessary printed wiring, and then it is developed to define the desired wiring. Next the printed wiring on the panel is solder plated and the panel scrubbed clean, leaving solder plated wiring on a clean copper covered panel. Finally chemical etching removes the exposed unwanted copper, leaving only the solder plated circuitry on the panel.

During this process it is possible that one (or more) of the necessary holes may not have been drilled, or that the copper plating on the walls of a hole lacks circuit continuity. Then too, final inspection may show that some of the printed wiring on the surface of the panel is discontinuous or broken, thus making the panel worthless scrap. It is possible for such mistakes to be rectified if discovered before the panel had been etched, because it is not too late at this stage for the panel to be reprocessed. However, if etching has occurred the panel must be scrapped, resulting in considerable loss of money and time. These are only a few of many conditions which may be encountered during the presently practiced method of manufacture or fabrication of such panels.

The important object of the present invention is to provide an inexpensive and rapid method and apparatus for rectifying such errors at any time during or after the fabrication of a printed circuit panel, by providing apparatus making it possible to accomplish spot operations, such as electrolytic etching or plating, anywhere on the panel at any time during its fabrication.

To the foregoing general ends the invention contemplates the utilization of apparatus for maintaining a selected spot on a printed circuit panel flooded with an electrolyte as a part of an electrical circuit, thus to effect either plating or etching at the spot depending upon the direction of electrical current through the circuit. The invention is particularly effective when used to repair defective printed wiring on the panels such as the unplated walls of a hole where through connection of plated wiring on opposite sides of the panel is desired.

The manner in which the foregoing and other objects of the invention may best be achieved, will be fully understood from a consideration of the following detailed description taken together with the accompanying drawings, in which:

FIG. 1 is a perspective view of apparatus for carrying out the method of the invention;

FIG. 2 is a fragmentary sectional view of a portion of the apparatus with parts broken away, and including a circuit diagram;

FIG. 3 is a view of a fragmentary portion of the apparatus; and

FIG. 4 is a perspective view showing a modified element of the apparatus.

A preferred form of the novel apparatus for practicing the method of the invention, as illustrated in FIG. 1, comprises a base member or plate 10 provided with a groove 11 throughout its length. The groove is formed by upstanding portions 12 formed integrally with the base, or by other suitable means, and provides means for supporting the printed circuit panel "P" in an upright position on the base. Brackets 13 are pivotally mounted on the plate 10 on opposite sides of groove 11, as indicated at 14, by means of bosses 15 formed integral with or secured to base plate 10. The brackets are provided with slots 16 in which funnel-like elements 17 are mounted as by H-shaped members 18 which are slidable throughout the length of the slot.

By sliding panel "P" transversely of plate 10 through grove 11, and by sliding elements 18 upwardly or downwardly on brackets 13, the funnel elements 17 may be aligned against opposite sides of the panel at any preselected position or spot thereon. To hold the funnels against the panel, a bolt 19 is pivotally secured at one end to the top of one of the brackets 13, as indicated at 20, in a manner whereby its other end can be dropped in a slot 21 provided at the top of the other bracket. A wing nut 22 is threaded on the outer end of the bolt, and when turned in one direction serves to draw the brackets toward each other, thus to force the funnels tightly against the opposite sides of the panel, as more clearly illustrated in FIG. 2. Conversely, loosening of wing nut 22 permits the bolt to be moved out of slot 21 thereby freeing the brackets for pivotal movement away from the panel, thus permitting removal of the panel from groove 11.

Also shown mounted on panel 10 is a motor 23 for driving a fluid pump 24 to circulate a suitable electrolyte from container 25 through funnels 17 and hole 27 by way of conduits 26. A suitable electrolyte in accordance with the invention, may be an aqueous solution containing a salt of the metal to be deposited. Of course electroplating is an old and well known art, but if additional information regarding it is needed, reference may be had to Gray's book "Modern Electroplating" published by the Electrochemical Society in 1953. Preferably the electrolyte is of sufficiently high conductivity to provide for relatively rapid plating or etching. It will be understood that all portions of the apparatus which come into contact with the electrolyte preferably will be formed of a material which is non-reactive with the electrolyte thus to avoid contamination of the solution.

With reference to FIG. 2, it will be seen that as the electrolyte flows through funnels 17 it is in contact with an electrode 28 extending through and insulated from the sidewall of funnel 17 on the right hand side of panel "P." Other electrodes 29 are urged into contact with the printed wiring 30 on both sides of the panel "P" by any suitable well known means (not shown). The electrodes are connected through switches S1 through S4, to a suitable source of electrical energy, such as the battery indicated at 31. The circuit is completed through the electrolyte and the printed wiring 30.

As diagrammatically shown in this figure, electrode 28 is connected to the positive side of the battery through switch S1, thus making it the anode, while the electrodes 29 are connected to the negative side of the battery through switch S2 thus making them the cathodes of the circuit. With the circuit so connected, plating of the walls of hole 27 will be accomplished. Prior to plating in this manner, of course, hole 27 is coated with, and conductively connected to the printed wiring 30 by a thin film of an electrically conductive material, such as metallic paint, to which the plating material adheres during the electroplating operation. When the desired thickness of metal has been deposited—which may be determined by the length of time the switches are closed—the plating operation is terminated by opening the circuit at the switches.

While the present invention is primarily concerned with plating, it will be understood that it is equally useful for etching whereby an undesirable portion of the printed wiring on panel "P" may be removed. The same electrolyte used for plating may also be used for etching, or any other of the many well known electrolytes, such as an aqueous solution of nitric acid, or sodium nitrite, may be used.

Of course, when it is desired to etch instead of plate, the direction of current must be reversed. In this case switch actuator 37 is moved downwardly, as viewed in this figure, thus to open switches S1 and S2 and close switches S3 and S4 thereby reversing the current flow and the anode and cathode in the circuit.

Still with reference to FIG. 2, it will be seen that the outlet edge of each funnel is provided with a soft grommet 32 of suitable material for sealing the funnels tightly against the panel to prevent leakage of the fluid electrolyte. It will also be noted, with reference to FIG. 3, that H-shaped members 18 are provided with a member 33 spring biased against brackets 13 in a manner permitting sliding adjustment of the funnels with respect to brackets 13, yet with sufficient pressure to hold members 18 in adjusted position until the brackets lock them in place by bolt and nut 19 and 22, respectively. Funnels 17 are loosely pivotally mounted in members 18 by means of pins 34 (FIG. 2) and slots 35 (FIG. 1), thus to permit self-alignment when pressed against the panel. This construction also provides for quick and easy replacement of the funnels when desired.

By providing different shaped funnel elements other operations are possible within the scope of this invention. For example, if it is desired to repair a severed printed wire, as indicated at 36 on FIG. 1, a rectangularly-shaped funnel 40 (FIG. 4) may be provided to fit over the area. The area between the loose ends of the severed wire is first coated with a suitable electrically conductive paint. Preferably the funnel has both an inlet and an outlet conduit, 41 and 42 respectively, the outlet preferably being adjacent the mouth of the funnel. The funnel on the other side of the panel is inactive except to steady the panel. In fact it may be replaced by an ordinary back-up member, or even done away with entirely. In this manner, spot operations on one side only of the panel—either plating or etching, depending upon the current direction—may be inexpensively effected.

While in the preferred form, just described, the fluid is circulated through the hole 27 it will be understood that the walls of the hole may be treated by blocking off one end, the right hand end as seen in FIG. 2, and then flooding the funnel 17 on the left hand side of panel "P" and the hole 27 with the electrolyte which is then connected in circuit by closing the desired switches depending upon whether plating or etching is to be done.

In conclusion, it is now evident that this invention affords an inexpensive apparatus and method for effecting electrolytic treatment of small areas of larger objects and more specifically for quickly correcting or repairing defects in printed circuit panels at any stage of their fabrication, thus making possible large savings of time and money.

I claim:

1. The method of electrically interconnecting electrical wiring plated on opposite sides of a substantially flat panel of electrically insulating material, said method comprising, forming a hole through the panel and the wiring on opposite sides of the panel, interconnecting said wiring with an electrically conductive material coated on the walls of said hole and on portions of the wiring overlying the opposite sides of the panel, sealing the area surrounding the opposite ends of said hole—including coated portions of the wires—with enclosure members, and flooding said enclosure members and said hole with an electroplating electrolyte forming an element of a closed electrical circuit including said wiring and said coating as the cathode, an anode extending into said electrolyte, and a source of electrical potential.

2. The method of electrically interconnecting electrical wiring plated on and overlying opposite sides of a substantially flat panel of electrically insulating material, said method comprising forming a hole through the panel and the wiring on opposite sides of the panel, interconnecting said wiring with an electrically conductive material coated on the walls of said hole and on portions of the wiring overlying the opposite surfaces of the panel, sealing the area surrounding the opposite ends of said holes—including coated portions of the wires—with enclosure members, and circulating through said enclosure members and said hole an electroplating electrolyte forming an element of a closed electrical circuit including said wiring and said coating as the cathode, an anode extending through the wall of one of said enclosure members into the electrolyte, and a source of electrical potential, the flow of the electrolyte being in a direction from said anode to said cathode.

3. Apparatus for electrically interconnecting printed wiring overlying opposite surfaces of a printed circuit panel by plating the walls of a hole in the panel and adjacent portions of the overlying printed wiring on the opposite surfaces of the panel, the walls of the hole and the said portions of printed wiring having first been interconnected with an electrically conductive material thinly coated on the said walls of the hole and portions of the wiring adjacent the ends of the hole, said apparatus comprising, means for slidably supporting said panel on one edge portion, a pair of open ended enclosures, means for mounting said enclosures for slidable movement in a direction transverse to the movement of said panel thus enabling said enclosures to be disposed over a wide selection of surface portions of said panel, means for sealing the open ends of said enclosures against the opposite sides of said panel and over the areas surrounding said hole and including coated portions of said wiring on the opposite sides of said panel, said wiring serving as a cathode, an anode, means for connecting said anode and cathode to a source of electrical potential, and means for circulating an electroplating electrolyte over said anode, through one enclosure, through said hole, and the other of said enclosures thus bringing the electrolyte into contact with said coating material to effect the said plating to electrically interconnect the wiring on the opposite sides of said panel.

4. A construction according to claim 3 wherein said panel supporting means comprises a base member having a transverse groove for slidably supporting said panel in an upright position, and said enclosure mounting means comprises upright brackets mounted on opposite sides of said groove, means mounted on said brackets for supporting said enclosures for slidable movement in directions transverse to that of said panel, and means for forcibly biasing said enclosures against said panel in their selected positions.

References Cited in the file of this patent

UNITED STATES PATENTS

| | | |
|---|---|---|
| 565,975 | George | Aug. 18, 1896 |
| 1,403,903 | Hamister | Jan. 12, 1922 |
| 1,771,680 | Ishisaka | July 29, 1930 |
| 2,698,832 | Swanson | Jan. 4, 1955 |
| 2,699,425 | Nieter | Jan. 11, 1955 |

FOREIGN PATENTS

| | | |
|---|---|---|
| 19,919 | Great Britain | of 1892 |
| 26,504 | Great Britain | of 1912 |